United States Patent
Nakajima et al.

(10) Patent No.: US 6,787,893 B2
(45) Date of Patent: Sep. 7, 2004

(54) SEMICONDUCTOR DEVICE

(75) Inventors: Dai Nakajima, Tokyo (KP); Naoki Yoshimatsu, Tokyo (JP); Haruyuki Matsuo, Tokyo (JP); Ryuuichi Ishii, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 5 days.

(21) Appl. No.: 10/203,629

(22) PCT Filed: Jan. 23, 2001

(86) PCT No.: PCT/JP01/00417

§ 371 (c)(1),
(2), (4) Date: Aug. 19, 2002

(87) PCT Pub. No.: WO02/059969

PCT Pub. Date: Aug. 1, 2002

(65) Prior Publication Data

US 2003/0011057 A1 Jan. 16, 2003

(51) Int. Cl.⁷ .............................................. H01L 23/24
(52) U.S. Cl. ...................... 257/687; 257/685; 257/788; 257/710; 257/712; 257/723
(58) Field of Search ................................ 257/687, 704, 257/710, 712, 713, 787, 784, 723, 685, 698, 696, 788

(56) References Cited

U.S. PATENT DOCUMENTS

| 4,814,943 A | * | 3/1989 | Okuaki ........................ 361/783 |
| 5,289,039 A | * | 2/1994 | Ishida et al. ................. 257/796 |
| 2002/0024120 A1 | * | 2/2002 | Yoshimatsu et al. ......... 257/659 |

FOREIGN PATENT DOCUMENTS

| JP | 63-107147 | 5/1988 |
| JP | 10-12806 | 1/1998 |
| JP | 11-97617 | 4/1999 |

* cited by examiner

Primary Examiner—Nathan J. Flynn
Assistant Examiner—Pershelle Greene
(74) Attorney, Agent, or Firm—Oblon, Spivak, McClelland, Maier & Neustadt, P.C.

(57) ABSTRACT

A semiconductor device of the invention comprises a semiconductor element provided within a housing, a bonding wire, a sealing resin member covering the semiconductor element and bonding wire, and a sheet member. The sheet member is fixed in the housing and arranged out of contact with the bonding wire, and moreover buried in the sealing resin member. Because the sheet member restrains the sealing resin member from vibrating, the bonding wire is connected with improved reliability. In place of the sheet member, it is possible to use a pillar member fixed on an insulating substrate. The semiconductor device is suitable for use on a mobile body, such as a vehicle, which proceeds with vibrations.

19 Claims, 7 Drawing Sheets

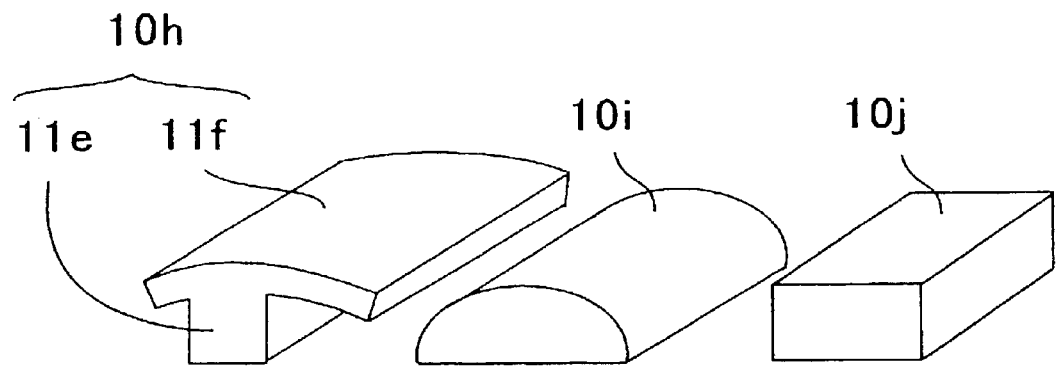
FIG.11a  FIG.11b  FIG.11c
FIG.12  PRIOR ART
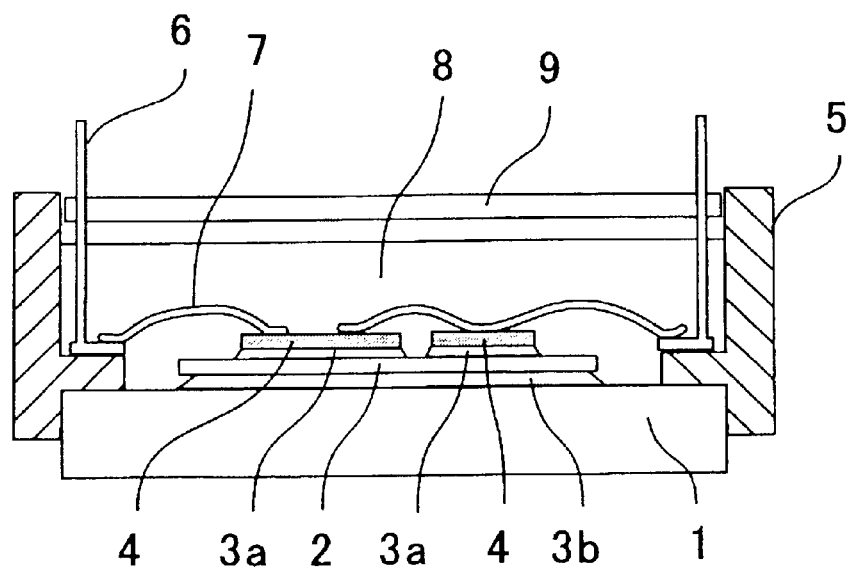

SEMICONDUCTOR DEVICE

TECHNICAL FIELD

This invention relates to a technical art for achieving the reliable connection of a bonding wire in a semiconductor device.

BACKGROUND OF THE INVENTION

Silicone resin is an organosilicon compound which has a basic formula where silicon having an organic group combines alternately with oxygen. The silicone resin has been used generally as an insulating material for sealing power semiconductor devices or the like, because of its little cure-shrinkage and excellent hermetic performance.

FIG. 12 is a sectional view showing an interior structure of a conventional semiconductor device sealed with a silicone resin. An insulating substrate 2 is mounted on a metal base plate 1 through a solder layer 3b. A semiconductor element 4 is mounted on the insulating substrate 2 through a solder layer 3a. A resin case 5 with a top opening is bonded to the base plate 1 and an electrode 6 is fixed in the vicinity of a sidewall of the resin case 5. A bonding wire 7 is in the form of an arch for example and connects electrically the semiconductor element 4 with the electrode 6.

A gel sealing resin member 8 is formed of silicone resin and covers the insulating substrate 2, the semiconductor element 4, the electrode 6 and the bonding wire 7. A lid 9 made of glass-epoxy resin covers a top opening of the case 5 and shields the sealing resin member 8 from the air. The base plate 1, the case 5 and the lid 9 constitute a housing.

When vibrations of e.g. 10G or so in magnitude were applied periodically in order to evaluate the reliability of a semiconductor device with the structure mentioned above, failure in connection was found in the bonding wire 7. The failure in connection results from fatigue fracture of the bonding wire 7. The endurance of a bonding wire 7 against vibrations largely relies upon a laying site and shape of the bonding wire 7.

The vibration of the semiconductor device makes the gel sealing resin member 8 jolt within the housing. Then a tensile stress with a magnitude corresponding to the jolting amplitude of the sealing resin member 8 is applied on the bonding wire 7 which is in close contact with the sealing resin member 8. The amplitude of the sealing resin member 8 is small in the vicinity of the sidewall of the case 5 but large in a central region of the case 5, particularly in the central region near the top surface of the sealing resin member 8. Because tensile stress is nearly proportional to the amplitude of the sealing resin member 8, the maximal tensile stress is applied on an area near the summit of an arch in the bonding wire 7.

The tensile stress applied on the bonding wire 7 is supported by a reaction force at bonded points of the bonding wire 7 with the electrode 6 or semiconductor element 4. Because the tensile stress on the bonding wire 7 is nearly proportional to the contact length of the bonding wire 7 and the sealing resin member 8, larger tensile stress is applied on the bonded point, as the bonding wire 7 becomes longer.

Moreover, the bending stress applied on the bonding wire 7 is focused on the part where the bonding wire begins to describe an arch from a bonded point, because the bonding wire 7 which is in the form of an arch is constrained on the bonded points with the electrode 6 and semiconductor element 4. The bending stress increases as the height of an arch summit from the bonded point becomes larger.

Because the tensile stress due to the vibration acts periodically on the vicinity of the bonded point on which bending stress is focused, fatigue fracture of the bonding wire 7 proceeds at this area. The bonding wire 7 with longer length and larger height of arch, disposed in the central region of the case 5 where the sealing resin member 8 jolts greatly in amplitude, will have less number of endurance cycles to a fracture.

Moreover, in a case where a case 5 has a step in the vicinity of its sidewall, the amplitude of sealing resin member 8 changes greatly before and after the step. Thus, the bonding wire 7 will have a focus of stress in the vicinity of the step and cause fractures readily.

There is an exemplary disclosure of a conventional semiconductor device that is designed to prevent fracture of a bonding wire 7 in Japanese Patent Laid-Open No. 246430/1997. This device employs, on a surface of gel member, a protection film made of a material having an elastic modulus greater than the gel, e.g. epoxy resin, to suppress vibration of the gel. This method requires the formation of a protection film in addition to the gel member. Accordingly, the process for resin curing is carried out twice and results in low productivity. Furthermore, because linear expansion coefficient is different between the material for forming a protection film and the material for forming a case, the protection film peels off readily from the close-contact face of the case. In the worst case, if an arch summit of a wire is arranged around a center of the semiconductor device where the amplitude of gel is maximal, the protection film cannot sufficiently restrain the vibration of the wire.

Japanese Patent Laid-Open No. 050897/1998 discloses another example of a semiconductor device. Epoxy resin is supplied to between a sidewall of the case and a partition plate provided in the vicinity of a wire bonded point, to cover the vicinity of the bonded point with a cured epoxy resin. Although the covering relaxes the stress focused in the vicinity of the wire bonded point, the additional process of supplying/curing the epoxy resin lowers the productivity. Furthermore, because the state of stress greatly changes in the region beyond the partition plate, the wire is readily broken around right above of the partition plate. In addition, it is impossible to prevent the gel member from jolting at around an arch summit of the wire where the maximal stress takes place due to gel vibration.

Furthermore, Japanese Patent Laid-Open No. 107147/1988 discloses a semiconductor device having vibration preventing members which are arranged to cross lengthwise and breadthwise each other on the backside of a package cap. When a semiconductor device is equipped with a control board inside which supplies control signals to a semiconductor element, the effect of the vibration preventing members considerably decrease, because the control board is located below the vibration preventing members. Consequently, it is practically impossible to provide a control board within the semiconductor device. Furthermore, it is needed to achieve gel curing after gel injection is made followed by the cap fixing, or to achieve gel injection/curing after the cap fixing is made. Accordingly, it is difficult to confirm that the cured gel is in good state or not. Unless the trouble on the gel such as cure impediment can be determined, productivity will be hindered.

Accordingly, it is an object of the present invention to provide a semiconductor device at low cost which works with high reliability even if used in a situation to cause vibration.

DISCLOSURE OF THE INVENTION

A semiconductor device according to the present invention comprises: a semiconductor element provided within a housing having an electrode; a bonding wire connecting the electrode with the semiconductor element; a sealing resin member covering the electrode, the semiconductor element and the bonding wire; and a sheet member fixed in the housing, arranged out of contact with the bonding wire and buried in the sealing resin member. Because the sheet member acts as a vibration reducing member which restrains the vibration of the sealing resin member, the bonding wire is connected with higher reliability. Therefore the semiconductor device attains an increase in lifetime.

The sheet member may have an opening portion, wherein the opening ratio is desirably not less than 20% and not more than 80%. When the opening ratio falls within the range above, the sheet member firmly adheres to the sealing resin member. The opening portion of the sheet member can be arranged above a bonded point of the electrode with the bonding wire or above a bonded point of the semiconductor element with the bonding wire. The sealing resin member thermally swelled escapes upward through the opening portion. Because the sheet member may have a shape extending along a shape of the bonding wire, the clearance to the bonding wire can be reduced.

In the above area of the sealing resin member may be provided a space member which is not less than 10% and not more than 100% in volume of the sealing resin member. When the sealing resin member thermally swells, the space member restrains the increase of pressure inside the semiconductor device.

A control board may be arranged above the sheet member. The sheet member also restrains the vibration of the control board buried in the sealing resin member. The sealing resin member may be formed of silicone resin.

Moreover, close contact of the sheet member may be made with the upper surface of the sealing resin member. In this case, the sheet member may comprise an upper member and a lower member, and the bottom surface of the lower member contacts the upper surface of the sealing resin member closely.

The lower member and the upper member are easy to bond because they may be fixed together with an adhesive layer. Clearance to the bonding wire is reduced because the lower member may have a shape which extends along a shape of the bonding wire.

Furthermore, the semiconductor device according to the present invention may have a pillar member in place of the sheet member. The pillar member is out of contact with the bonding wire and fixed on an insulating substrate, and further, buried in the sealing resin member. Because the pillar member acts as a vibration reducing member which restrains the vibration of the sealing resin member, reliability of connection with the bonding wire increases. Therefore the semiconductor device attains an increase of lifetime.

The clearance from the pillar member to the bonding wire can be decreased, because the pillar member may have a shape extending along a shape of the bonding wire. When the pillar member made of aluminum or copper is bonded to a copper pattern which is interposed between the semiconductor element and the insulating substrate, an electroconductive path is formed.

BRIEF DESCRIPTION OF THE DRAWINGS

FIG. 11 is a perspective view representing shapes of pillar members according to Embodiment 4; and FIG. 12 is a sectional view showing a conventional semiconductor device.

BEST MODE FOR CARRYING OUT THE INVENTION

Explanation will be made on a semiconductor device according to the present invention according to the drawings.

Embodiment 1

Figure 1:
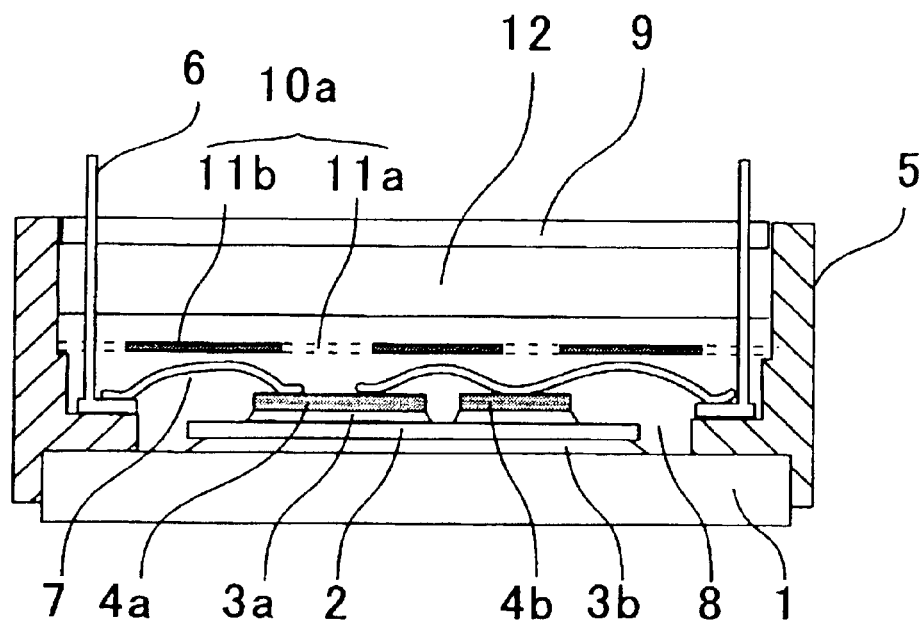
FIG. 1 is a sectional view showing Embodiment 1 of a semiconductor device according to the present invention.

FIG. 1 is a sectional view showing a structure of a semiconductor device according to Embodiment 1 of the invention. A metal base plate 1 provided for heat dissipation is formed of a material high in heat conductivity, e.g. copper (nickel-plated on the surface), aluminum, copper-molybdenum alloy or the like, on which an insulating substrate 2 is mounted through a solder layer 3b. A flow passage is provided within the base plate 1 in order to enhance cooling effects. A refrigerant may be flowed in the flow passage.

The insulating substrate 2 is formed of $Al_2O_3$, SiN, AlN, $SiO_2$, BN or the like, on which a copper pattern 13 (see FIG. 2) is bonded by diffusion soldering or the like. On the insulating substrate 2, semiconductor elements 4a, 4b are bonded through a solder layer 3a.

The semiconductor element 4a and the semiconductor element 4b represent, for example, an IGBT (Insulated Gate Bipolar Transistor) and a fly wheel diode, the both of which are used in pairs. The semiconductor element includes, besides them, a MOSFET (Metal Oxide Semiconductor Field Effect Transistor), a GTO thyristor (Gate Turn Off thyristor), and so on. The semiconductor device of the invention is not limited by a capacity or the kind of semiconductor elements to be incorporated. In the below, the semiconductor elements 4a, 4b are denoted as a semiconductor element 4.

A resin case 5 is adhered to the base plate 1 and an electrode 6 is fixed in the vicinity of its sidewall. A bonding wire 7, which has a form of an arch for example, is an aluminum wire, a gold wire or the like and electrically connects the semiconductor element 4 with the electrode 6. A sheet member 10a is arranged above the bonding wire 7 without contacting the bonding wire 7. This member is fixed on the case 5 by a method of adhesion, press-bonding, screwing or the like, for example, through utilizing a step formed in the sidewall of the case 5.

A gel sealing resin member 8, formed of a silicone resin, covers the insulating substrate 2, the semiconductor element 4, the electrode 6, the bonding wire 7 and the sheet member 10*a*. The top opening of the case 5 is closed by a lid 9 formed of e.g. glass-epoxy resin, PPS (Poly Phenylene Sulfide) resin or the like. The interior of the case 5 is shielded from the external air. The base plate 1, the case 5 and the lid 9 constitute a housing.

A space member 12 is provided between the sealing resin member 8 and the lid 9. When the sealing resin member 8 increases its volume by thermal expansion, the space member 12 prevents the sealing resin member 8 from contacting a housing structure such as a lid, or the housing from rising the pressure inside. A larger volume of the space member 12 is preferable in the sense of preventing pressure rise. However, if it unnecessarily large, the device increases in size to incur higher cost. Practically, the volume of the space member 12 is from 10% to 100%, further desirably from 20% to 60%, of the volume of the sealing resin member 8.

Figure 2:
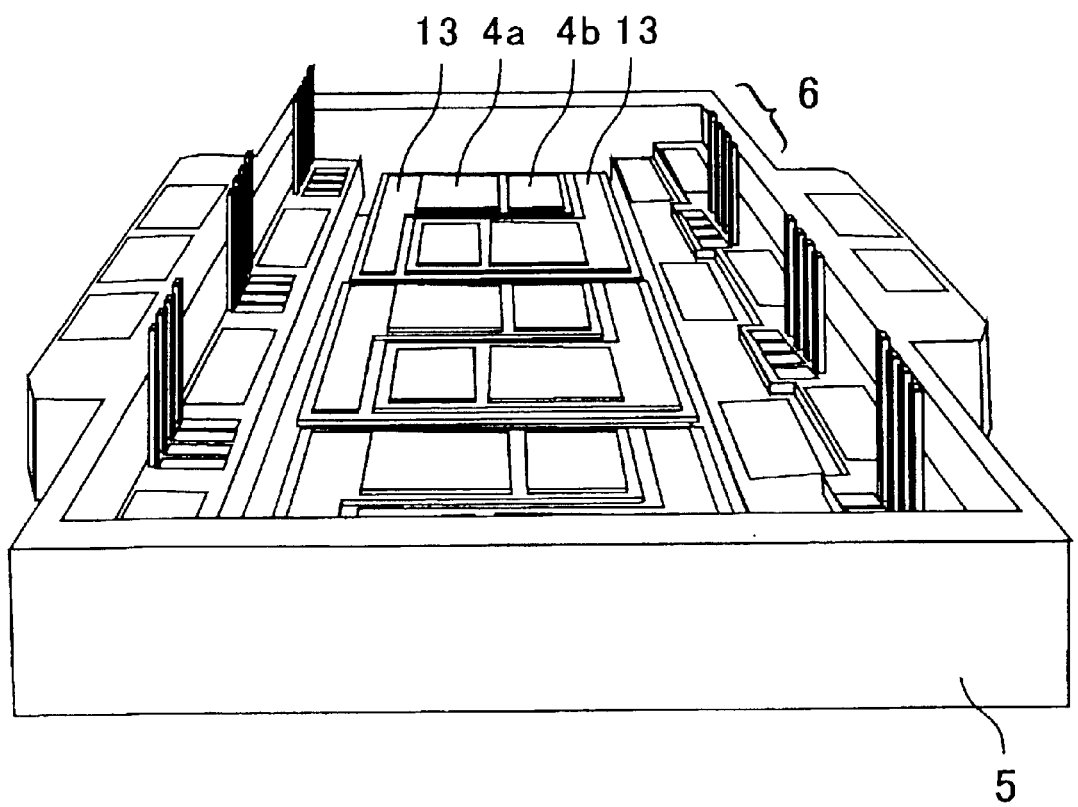
FIG. 2 is a perspective view representing an interior structure of a semiconductor device before bonding wires are connected.
Figure 3:
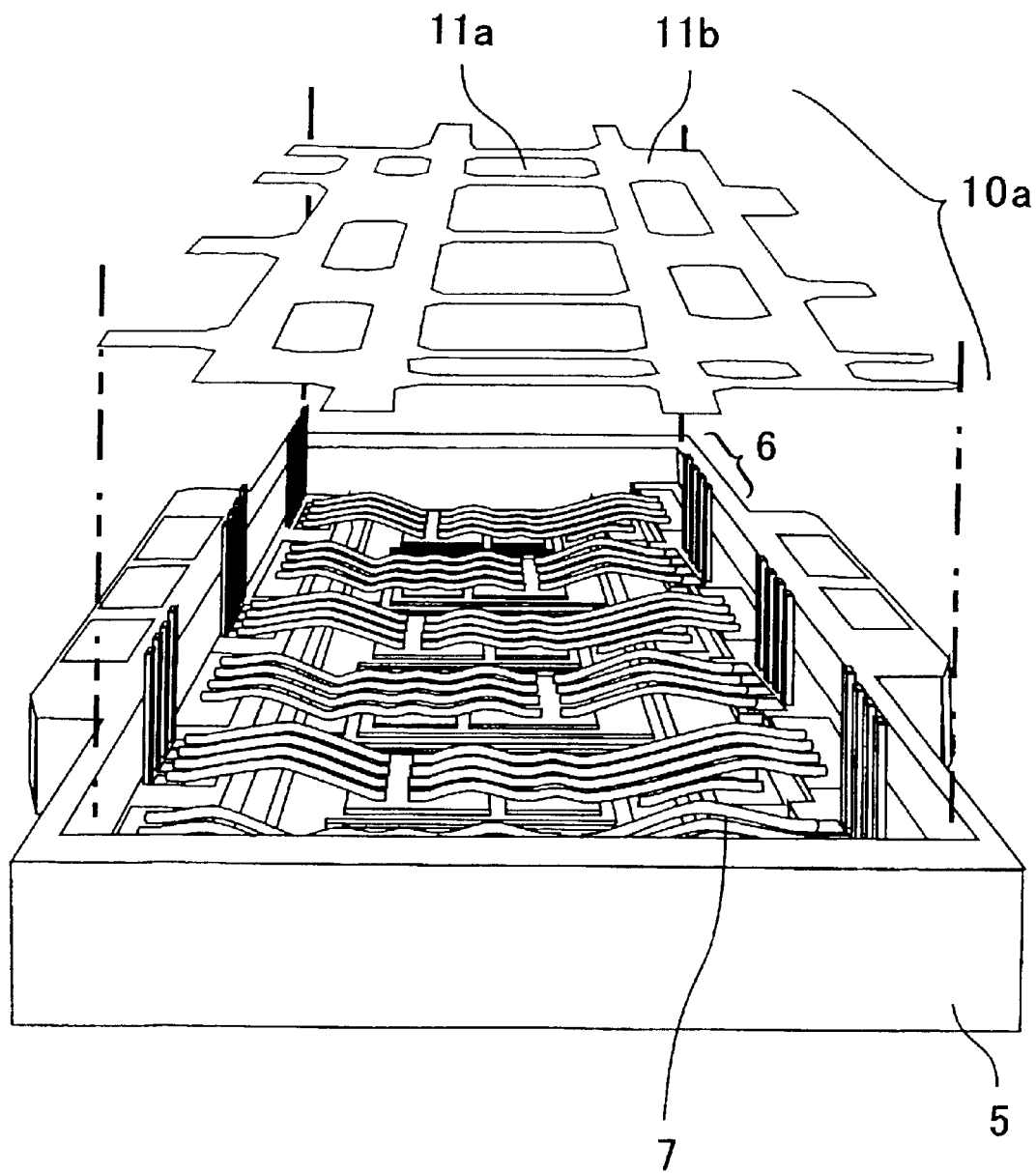
FIG. 3 is a perspective view representing an interior structure of a semiconductor device after bonding wires are connected.

FIG. 2 and FIG. 3 are perspective views illustrating an interior of the semiconductor device. FIG. 2 shows a case where connection of the electrode 6 and the semiconductor element 4 is not achieved with the bonding wire 7, while FIG. 3 shows a case where the connection of the electrode 6 and the semiconductor element 4 is achieved with the bonding wire 7.

FIG. 2 describes six sets of IGBTs 4*a* and fly wheel diodes 4*b* (note that, the nearest one from a viewer among these is hidden by the case 5 and not seen). A L-shaped copper pattern 13 is bonded to a back plate (corresponding to a collector electrode) of the semiconductor element 4 to form an electroconductive path to the electrode 6. Four electrodes 6 are arranged to make a set, wherein six sets are depicted in the vicinity of the sidewall of the case 5.

In an upper area of the FIG. 3 is depicted a sheet member 10*a* which is to be fixed on the case 5. The sheet member 10*a*, worked out from a plate, has an opening portion 11*a* and a sheet portion 11*b* in predetermined positions. The desirable thickness of the sheet member 10*a* is approximately 0.3–3 mm in view of strength and easiness of the processing.

When the sheet member 10*a* is fixed on the case 5, the opening portion 11*a* is arranged above the bonded point of the bonding wire 7 and the sheet portion 11*b* in the vicinity of the arch summit (see FIG. 1). The opening portion 11*a* is so provided also in the vicinity of the electrode 6 that the sheet member 10*a* is out of contact with the electrode 6.

Silicone resin is injected after fixing the sheet member 10*a* onto the case 5. The case 5 is then placed in an oven to cure the silicone resin at a predetermined temperature for a predetermined time. Thereby is formed a gel sealing resin member 8 in which the sheet member 10*a* is buried.

The anchor effect of the opening portion 11*a*, in addition to the adhesive property of silicone resin, makes the sealing resin member 8 adhere tightly to the sheet member 10*a*. Even if vibration is applied to the semiconductor device, the sheet member 10*a* fixed on the case 5 suppresses the amplitude of the sealing resin member 8 to a large extent, hence reducing the tensile stress caused on the bonding wire 7. As a result, endurance cycles in which bonding wire 7 is tested until it is fatigue-fractured increase in number, thus achieving the lifetime increase of the semiconductor device. Moreover, even if the sealing resin member 8 is thermally expanded in volume by the temperature rise of use environment, the thermally swelled sealing resin member 8 escapes upward through the opening portion 11*a*. Hence the semiconductor device is allowed to be used in a wider rage of temperature.

The lid 9 is attached after the silicone resin is cured. Consequently, the cured state of silicone resin can be confirmed by optical test (visual inspection). If the resin has a trouble like cure hindrance, abnormality of the gel can be positively determined.

The opening ratio of the sheet member 10*a* (the ratio of an area of the opening portion 11*a* to a total area of the sheet member 10*a* before opening) is desirably 20% or greater, more preferably 30% or greater, in order to expect a sufficient anchor effect. It is however noted that the opening ratio is desirably 80% or less, more preferably 70% or less because vibration reducing effect decreases as the opening ratio becomes larger.

The clearance between the arch summit of bonding wire 7 and the sheet portion 11*b* is, desirably, as small as possible within a range where breakdown strength is not problematic. Although the lower limit of the clearance relies on an applied voltage and processing accuracy in each member, a typical limit is approximately 3 mm in a case where the sheet member 10*a* is made of metal. The clearance, if increased, weakens the vibration reduing effect and increases product thickness. Accordingly, the sheet member 10*a* is preferably arranged such that the distance between the summit of bonding wire 7 and the surface of sealing resin member 8 is approximately one-third or less of the distance between the summit of bonding wire 7 and the bonded point of bonding wire 7. Practically, it is 10 mm or less, desirably 6 mm or less.

When an endurance test was conducted by giving 5 mm to the clearance between the bonding wire 7 and the sheet member 10*a*, the bonding wire 7 didn't break at all despite the resin case 5 had a step between the electrode 6 and the semiconductor element 4 as shown in FIG. 1. The endurance test applied a 20G-log sweep (10–300 Hz) to the semiconductor device in each of X, Y and Z directions serially, to observe the form of the device after 36 hours by the microscope.

Figure 4:
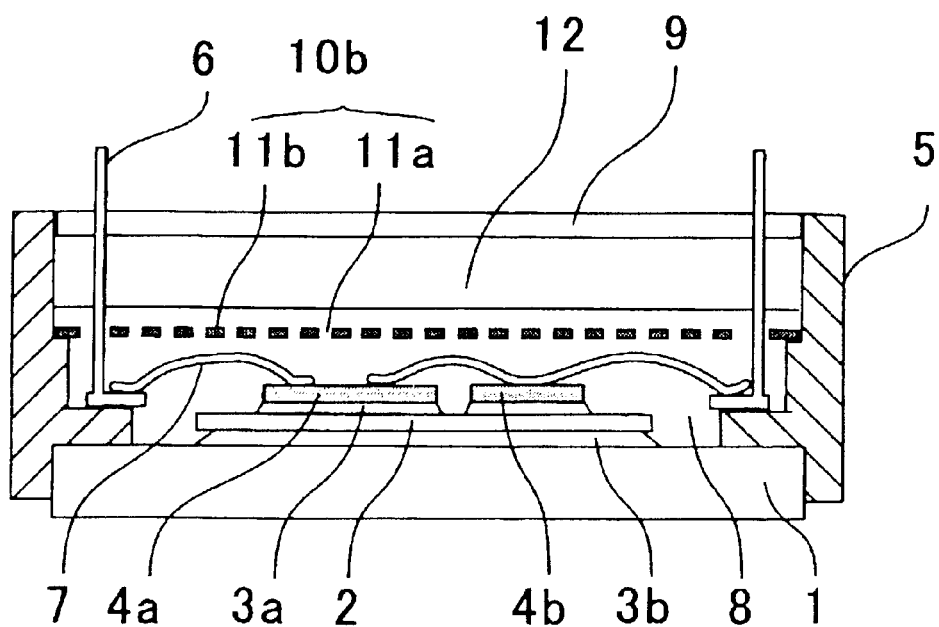
FIG. 4 is a sectional view showing another form of a semiconductor device according to Embodiment 1.

The opening portions 11*a* may be provided throughout the entire region of the sheet member 10*b* equally, as shown in FIG. 4. The opening portion 11*a* provided in the sheet member 10*b* is not necessarily circular but may be rectangular or in another form. Because anchor effect occurs throughout the entire region of the sheet member 10*b*, it increases adhesion between the sheet member 10*b* and the sealing resin member 8, resulting in enhancement of the vibration reducing effect. Moreover, the thermally swelled sealing resin member 8 is allowed to escape evenly toward the above area of the sheet member 10*b* through the opening portion 11*a*. Accordingly, the pressure rise in the interior of the semiconductor device is restrained, thereby the device is allowed to use in further wider temperature range.

Because the vibration reducing effect is enhanced, the opening portion 11*a* of the sheet member 10*b* may be arranged in the vicinity of the arch summit of the bonding wire 7. The opening portion 11*a*, if provided in the vicinity of the arch summit, can further reduce the clearance between the bonding wire 7 and the sheet member lob.

Figure 5:
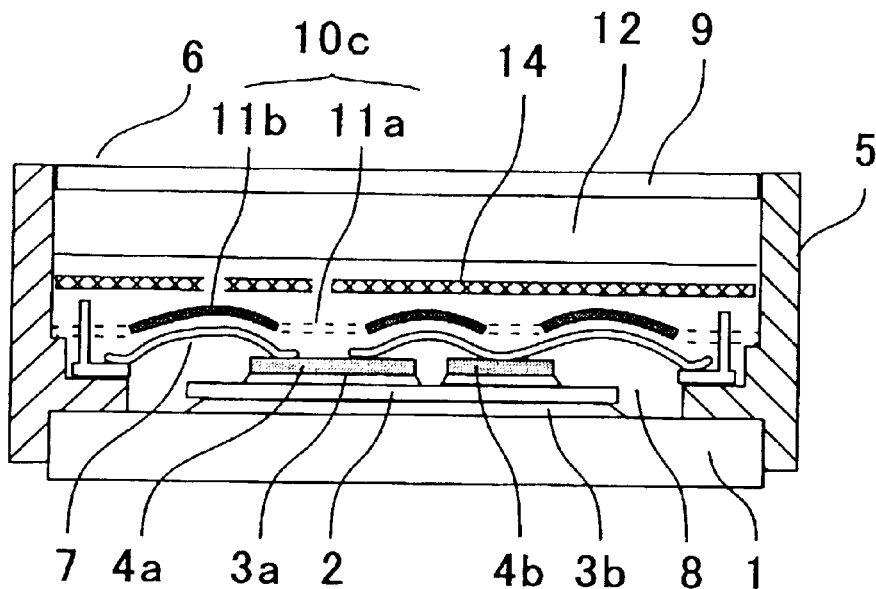
FIG. 5 is a sectional view showing still another form of a semiconductor device according to Embodiment 1.

Moreover, as shown in FIG. 5, the sheet member 10*c* may be partly curved to extend along an arch form of the bonding wire 7. Because the curved form of the sheet member 10*c* decreases the clearance to the bonding wire 7, the sealing resin member 8 is further restrained in amplitude. This results in further increase in the number of endurance cycles.

Incidentally, the semiconductor element 4 is controlled on the basis of a control signal outputted by a control board.

The control board, with control elements and the like mounted, has protecting functions to prevent excessive temperature rise of the semiconductor device and cut off the semiconductor device in the event of short-circuit. FIG. 5 shows a case in which a control board is provided in the semiconductor device, wherein the control board 14 is arranged above the sheet member 10c. A socket-type connector (not shown) is used to make the connection between the control board 14 and the outside, in this case. Because the sealing resin member 8 also covers the control board 14, it suppresses vibrations, thus making it possible to protect the control board 14 and control element (not shown) from vibration.

FIG. 1 is a case in which the control board (not shown) is provided outside the semiconductor-device housing. It is desirable that the control board is placed in an air-tight case in order to protect against dust and oil, if it is provided outside the device. Providing the control board outside the housing makes it possible to attach on the semiconductor device a control board in accordance with the use form of the semiconductor device. This makes it easy to accomplish a variety of requirements of the semiconductor device.

The sheet member 10a–10c, made from a thin plate, is easy to work out and realized at a low cost. Moreover, semiconductor device can be kept small in thickness. Although here is provided a sheet member 10a–10c made from one sheet, it may be divided into several sheets as required.

Embodiment 2

Figure 6:
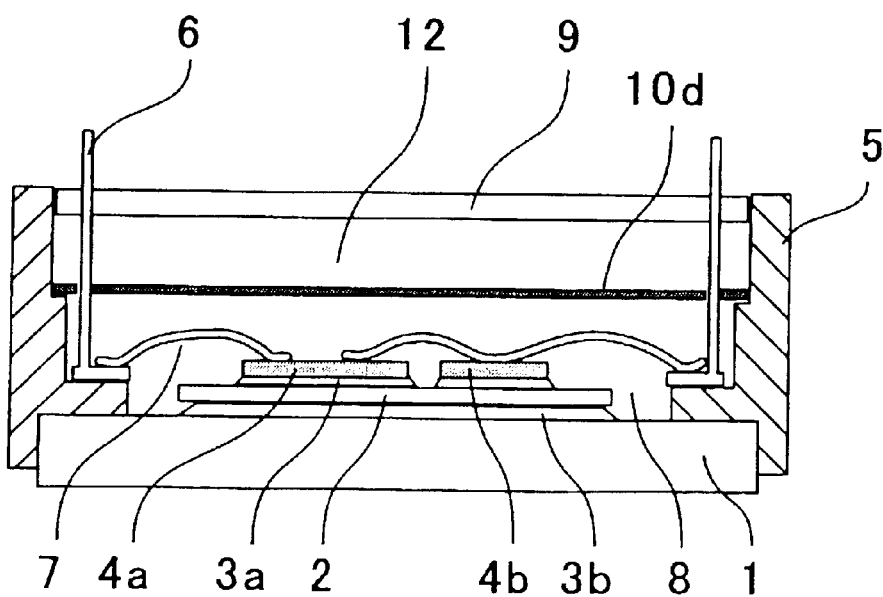
FIG. 6 is a sectional view showing Embodiment 2 of a semiconductor device according to the invention.

In FIG. 6 is shown a sectional view of a semiconductor device according to Embodiment 2 of the invention. The sheet member 10d, made from a thin plate without an opening, is fixed on a case 5 and, moreover, in close contact with an upper surface of a sealing resin member 8. Because the sealing resin member 8 is surrounded with the base plate 1, the case 5 and the sheet member 10d like a box, it reduces vibration effectively, particularly in a region close to the sidewall of the case 5. As a result, the tensile stress applied on the bonding wire 7 decreases, and the number of endurance cycles increases. Moreover, the sheet member 10d, made from a thin plate, is excellent in productivity and to be realized at a low cost. However, because the sealing resin member 8 is not secured of a way of escape, it is probable that the semiconductor device swells entirely when the sealing resin member 8 expands with a rise in environmental temperature. This embodiment is suited for the case in which the range of use temperature is not so wide.

In the case where the sheet member 10d is formed of a metal plate like aluminum or copper, the minimal open area enhances an electromagnetic shield effect and improves the resistance of the semiconductor device to noise. In addition, the electromagnetic noise radiated outwards from the semiconductor element 4 decreases. The reduction in radiated electromagnetic noises suppresses the false operations in the control board mounted inside or outside the semiconductor device.

The sheet member 10d may be formed from an insulating plate, such as of epoxy resin or polycarbonate. Although the electromagnetic shield effect doesn't work on the insulating plate, the clearance from the sheet member to the arch summit of the bonding wire 7 can be reduced. Moreover, it is possible to fix an aluminum sheet or copper sheet having a thickness of approximately 0.3 to 1 mm on an insulating plate with an adhesive sheet. The aluminum sheet or copper sheet fixed with an adhesive sheet corresponds to an underlying member in Embodiment 3 and acts as an electromagnetic shield sheet. The adhesive sheet is suitably formed of a material having heat resistance and less aging deterioration. The method of fixing a metal sheet on an insulating plate by using an adhesive sheet is not only simple as compared with the method of separately screwing the both but also improves the rigidity of the sheet member 10d by the composite effect.

Figure 7:
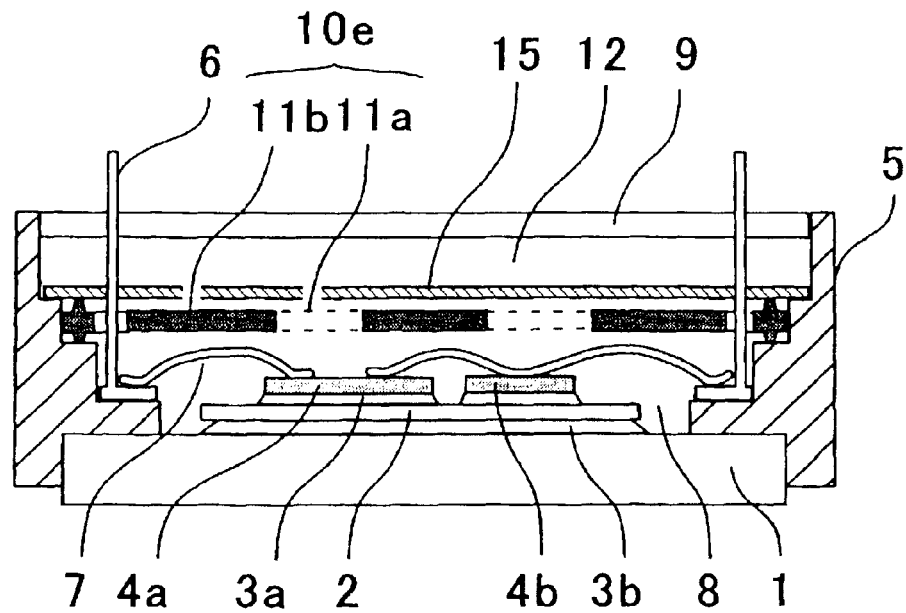
FIG. 7 is a sectional view showing another form of a semiconductor device according to Embodiment 2.

FIG. 7 is a sectional view showing another form of a semiconductor device according to Embodiment 2. A sheet member 10e having an opening portion 11a is formed of resin to have projections at ends thereof. An electromagnetic shield plate 15 in contact with the projections is arranged above the sheet member 10e. Fixing the electromagnetic shield plate 15 with the case 5 is a convenient method, because it fixes the sheet member 10e with the case 5 at the same time.

Figure 8:
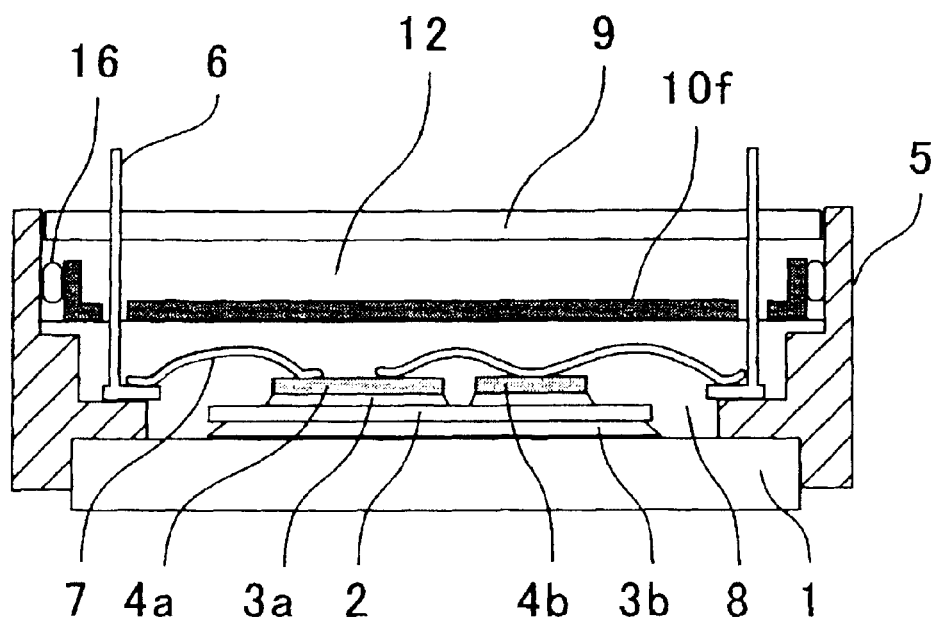
FIG. 8 is a sectional view showing still another form of a semiconductor device according to Embodiment 2.

FIG. 8 is a sectional view showing still another form of a semiconductor device according to the Embodiment 2. The sheet member 10f is bent upward at its end in the vicinity of the sidewall of the case 5. The gap between the end and the sidewall is sealed by a resilient member 16 having a large time constant, such as silicone resin, to keep air-tightness to the sealing resin member 8. The resilient member 16 has a springiness to allow the sheet member 10f to vertically move in accordance with thermal expansion of the sealing resin member 8, and then a wider range of use temperature is obtainable.

Embodiment 3

Figure 9:
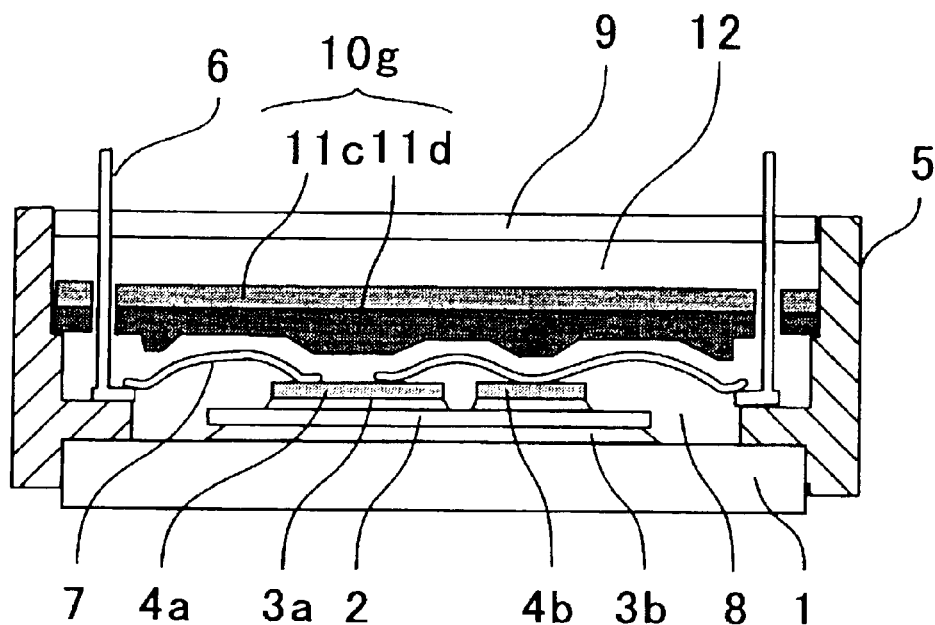
FIG. 9 is a sectional view showing Embodiment 3 of a semiconductor device according to the invention.

In FIG. 9 is shown a sectional view of a semiconductor device according to Embodiment 3 of the invention. The sheet member 10g comprises an upper member 11c with rigidity and a lower member 11d having an underside part curved moderately to extend along a form of bonding wire 7. Because the lower member 11d has a curved surface, the clearance is reduced between the bonding wire 7 and the sheet member 10g. The effect of suppressing vibration is enhanced at around an arch summit of the bonding wire 7. As a result, the number of endurance cycles increases to a large extent.

It is preferable that the upper member 11c and the lower member 11d are formed from a combination of two kinds of different materials, rather than from the same material. For example, a metal sheet of aluminum is used for the lower member 11d, and combined with the upper member 11c made of PPS resin by a method like press-bonding or adhesion. The combination makes it possible to realize a sheet member 10g light in weight and great in rigidity as compared with the case of forming the whole from aluminum.

Conversely, in the case of forming the lower member 11d with an insulating resin plate and the upper sheet 11c with a metal plate, the clearance to the bonding wire 7 can be made smaller than the case in which the lower member lid is a metal plate. Therefore the sealing resin member 8 is suppressed in amplitude around the arch furthermore. Moreover, in a case where a metal plate of aluminum is used for either of the upper member 11c or the lower member 11d, there is decrease in the electromagnetic noise radiated from the semiconductor element 4 or in the electromagnetic noise entering the semiconductor device. Hence the noise resistance of the semiconductor device is improved largely.

Embodiment 4

Figure 10:
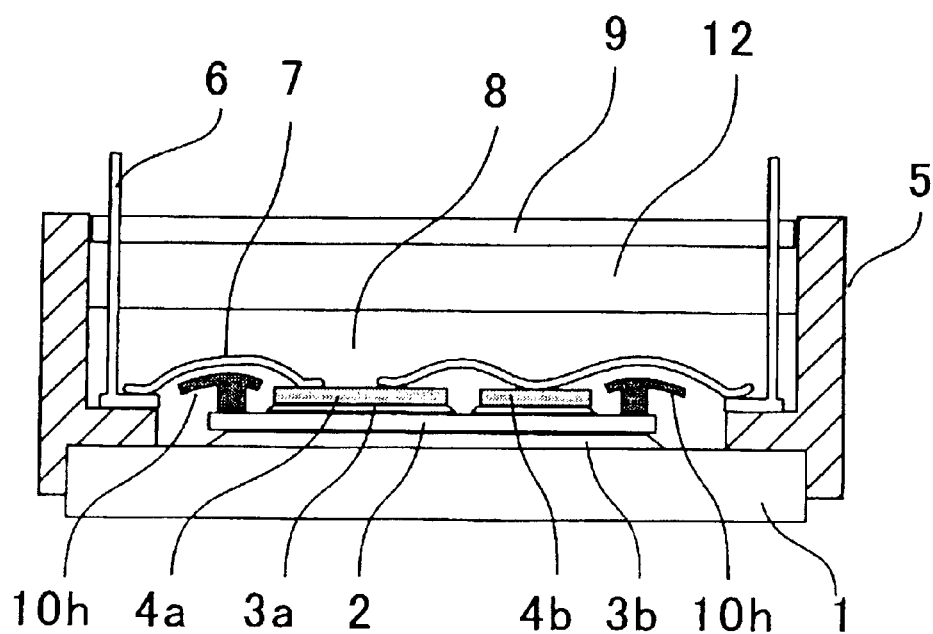
FIG. 10 is a sectional view showing Embodiment 4 of a semiconductor device according to the invention.

In FIG. 10 is shown a sectional view of a semiconductor device according to Embodiment 4 of the invention. A pillow member 10h is buried in the sealing resin member 8 and has a curved upper surface extending along the form of bonding wire 7, and moreover fixed on an upper surface of the insulating substrate 2. The bonding wire 7 extends over the pillow member 10*h* to connect the electrode 6 with the semiconductor element 4. The pillow member 10*h* is provided under the arch of the bonding wire 7 and effectively suppresses the vibration of the sealing resin member 8, particularly at around the bonded point of the bonding wire 7. Incidentally, although shown was the example where the bonding wire 7 is arranged to extend over the pillow member 10*h*, the pillow member 10*h* may be provided in a direction parallel with the direction the bonding wire 7 extends.

In Embodiments 1–3, the sheet members 10*a*–10*g* were fixed onto the case 5 after the bonding wire 7 was bonded to the electrode 6. This Embodiment 4 can simplify the process by using an insulating substrate 2 previously fixed with pillow members.

A three-dimensional form of the pillow member 10*h* is shown in FIG. 11(*a*). The fact that the pillow member 10*h* has a roof member lid spreading outer than the width of a leg 11*f* is a design creation on shape to prevent vibrations as effectively as possible, while the expensive insulating substrate 2 is in given dimensions. The other forms of the pillow member are shown in FIG. 11(*b*) and FIG. 11(*c*). A semi-cylindrical pillow member 10*i* offers a vibration reducing effect in a manner as the pillow member 10*h* does. A rectangular-parallelepiped pillow member 10*j* is readily available, however, the pillar members 10*h*, 10*i* produce greater vibration reducing effect.

A metal and an insulator may be both used for the pillow members 10*h*–10*j*. In the case of using a metal, the pillow members 10*h*–10*i* serve as an electroconductive path. The copper pattern 13 formed on the upper surface of the insulating substrate 2 serves usually as an electroconductive path of collector current and flows as large as several hundred amperes of current. As the current per unit area increases, electroconductive loss also increases. Accordingly, the copper pattern 13 requires a certain amount of thickness and width.

When the copper pattern 13 has increased thickness, it is probable that the insulating substrate 2 be broken due to thermal stress, because the insulating substrate 2 and the copper pattern 13 have different linear expansion rates, i.e. $5-7\times10^{-6}/^{\circ}$ C. and ca. $16\times10^{-6}/^{\circ}$ C. respectively. For this reason, the copper pattern 13 is usually increased in width. The increase in width also increases the size of the expensive insulation substrate 2, thereby raising product cost. Bonding the pillow members 10*h*–10*j*, formed of e.g. copper or aluminum, to the copper pattern 13 forms an electroconductive path at low cost.

INDUSTRIAL APPLICABILITY

As described above, a semiconductor device according to the invention has such a structure as to suppress the fatigue fracture on the bonding wire, even though it is used in a situation where vibrations are caused periodically. Therefore the semiconductor device is suitably mounted on a mobile body, such as a vehicle or a train, which proceed with vibrations.

What is claimed is:

1. A semiconductor device comprising:
   a semiconductor element provided within a housing having an electrode;
   a bonding wire connecting said electrode with said semiconductor element;
   a sealing resin member covering said electrode, said semiconductor element and said bonding wire;
   a sheet member fixed in said housing and arranged out of contact with said bonding wire, and further, buried in said sealing resin member; and
   a space member provided between said sealing resin and a lid of the semiconductor device.

2. A semiconductor device according to claim 1, wherein said sheet member has an opening portion, the opening portion having an opening ratio of not less than 20% and not more than 80%.

3. A semiconductor device according to claim 2, wherein the opening portion of said sheet member is arranged above a bonded point of said electrode with said bonding wire or above a bonded point of said semiconductor element with said bonding wire.

4. A semiconductor device according to claim 3, wherein said sheet member has a shape extending along a shape of said bonding wire.

5. A semiconductor device according to claim 2, wherein the space member has a volume not less than 10% and not more than 100%, compared with a volume of said sealing resin member.

6. A semiconductor device according to claim 2, comprising a control board for supplying a control signal to said semiconductor element, said control board being arranged above said sheet member and buried in said sealing resin member.

7. A semiconductor device according to claim 1, wherein said sealing resin member is formed from a silicone resin.

8. A semiconductor device comprising:
   a semiconductor element provided within a housing having an electrode;
   a bonding wire connecting said electrode with said semiconductor element;
   a sealing resin member covering said electrode, said semiconductor element and said bonding wire; and
   a sheet member fixed in said housing and arranged out of contact with said bonding wire, and further, contacting with an upper surface of said sealing resin member closely,
   wherein said sheet member comprises an upper member and a lower member.

9. A semiconductor device according to claim 8, wherein said lower member is formed of an aluminum plate or copper plate, to have an adhesive layer at an interface between said upper member and said lower member.

10. A semiconductor device according to claim 8, wherein said lower member has a shape extending along a shape of said bonding wire.

11. A semiconductor device comprising:
    a semiconductor element bonded on an upper surface of an insulating substrate through a copper pattern;
    an electrode for supplying electric power to said semiconductor element;
    a bonding wire connecting said semiconductor element with said electrode;
    a sealing resin member covering said semiconductor element, said electrode and said bonding wire; and
    a pillar member arranged between said bonding wire and said insulating substrate and out of contact with said bonding wire, fixed on said insulating substrate and buried in said resin member.

12. A semiconductor device according to claim 11, wherein said pillar member has a shape extending along a shape of said bonding wire.

13. A semiconductor device according to claim 11, wherein said pillar member is formed of aluminum or copper, and bonded to said copper pattern.

14. A semiconductor device comprising:

a semiconductor element provided within a housing having an electrode;

a bonding wire connecting said electrode with said semiconductor element;

a sealing resin member covering said electrode, said semiconductor element and said bonding wire; and a sheet member fixed in said housing and arranged out of contact with said bonding wire, and further, buried in said sealing resin member, wherein said sheet member has an opening portion, the opening portion having an opening ratio of not less than 20% and not more than 80%, and wherein the opening portion of said sheet member is arranged above a bonded point of said electrode with said bonding wire or above a bonded point of said semiconductor element with said bonding wire.

15. A semiconductor device according to claim 14, wherein said sheet member has a shape extending along a shape of said bonding wire.

16. A semiconductor device according to claim 14, comprising a control board for supplying a control signal to said semiconductor element, said control board being arranged above said sheet member and buried in said sealing resin member.

17. A semiconductor device according to claim 14, wherein said sealing resin member is formed from a silicone resin.

18. A semiconductor device comprising a semiconductor element bonded on an upper surface of an insulating substrate through a copper pattern;

an electrode for supplying electric power to said semiconductor element;

a bonding wire connecting said semiconductor element with said electrode;

a sealing resin member covering said semiconductor element, said electrode and said bonding wire; and a pillar member arranged out of contact with said bonding wire, fixed on said insulating substrate and buried in said resin member, wherein said pillar member has a shape extending along a shape of said bonding wire.

19. A semiconductor device comprising a semiconductor element bonded on an upper surface of an insulating substrate through a copper pattern;

an electrode for supplying electric power to said semiconductor element;

a bonding wire connecting said semiconductor element with said electrode;

a sealing resin member covering said semiconductor element, said electrode and said bonding wire; and a pillar member arranged out of contact with said bonding wire, fixed on said insulating substrate and buried in said resin member, wherein said pillar member is formed of aluminum or copper, and bonded to said copper pattern.

* * * * *

UNITED STATES PATENT AND TRADEMARK OFFICE
CERTIFICATE OF CORRECTION

PATENT NO. : 6,787,893 B2
DATED : September 7, 2004
INVENTOR(S) : Nakajima et al.

It is certified that error appears in the above-identified patent and that said Letters Patent is hereby corrected as shown below:

<u>Title page</u>,
Item [75], Inventors, should read:
-- [75] Inventors: Dai Nakajima, Tokyo (JP); Naoki Yoshimatsu, Tokyo (JP); Haruyuki Matsuo, Tokyo (JP); Ryuuichi Ishii, Tokyo (JP) --

Signed and Sealed this

Thirtieth Day of November, 2004

JON W. DUDAS
*Director of the United States Patent and Trademark Office*